US012717992B2

(12) United States Patent
Pal et al.

(10) Patent No.: US 12,717,992 B2
(45) Date of Patent: Aug. 25, 2026

(54) METHOD AND APPARATUS TO ENABLE CPU HOST-UNAWARE DYNAMIC FPGA RECONFIGURATION

(71) Applicant: Altera Corporation, San Jose, CA (US)

(72) Inventors: Rahul Pal, Bangalore (IN); Ashish Gupta, San Jose, CA (US); Gary Wallichs, San Jose, CA (US); Sreedhar Ravipalli, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 17/956,555

(22) Filed: Sep. 29, 2022

(65) Prior Publication Data

US 2023/0027807 A1 Jan. 26, 2023

(51) Int. Cl.

| | |
|---|---|
| ***G06F 30/343*** | (2020.01) |
| ***G06F 13/10*** | (2006.01) |
| ***G06F 13/16*** | (2006.01) |
| ***H03K 19/17728*** | (2020.01) |

(52) U.S. Cl.

CPC .......... *G06F 30/343* (2020.01); *G06F 13/102* (2013.01); *G06F 13/1668* (2013.01); *H03K 19/17728* (2013.01); *G06F 2213/0026* (2013.01)

(58) Field of Classification Search

CPC .. G06F 30/343; G06F 13/102; G06F 13/1668; G06F 2213/0026; H03K 19/17728

See application file for complete search history.

(56) References Cited

U.S. PATENT DOCUMENTS

| | | | | |
|---|---|---|---|---|
| 10,164,639 | B1 * | 12/2018 | Roberts | G06F 9/5077 |
| 10,447,273 | B1 * | 10/2019 | Roberts | G06F 15/7867 |
| 2016/0380635 | A1 * | 12/2016 | Roberts | G06F 15/7892 326/38 |
| 2019/0146829 | A1 * | 5/2019 | Cheng | G06F 15/7871 718/108 |
| 2021/0119632 | A1 * | 4/2021 | Zhu | G01R 31/318519 |
| 2022/0113756 | A1 * | 4/2022 | Maheshwari | G06F 1/06 |

* cited by examiner

*Primary Examiner* — Nimesh G Patel

(74) *Attorney, Agent, or Firm* — Fletcher Yoder, P.C.

(57) ABSTRACT

The present disclosure is directed to enabling operation of a field programmable gate array (FPGA) while preventing application quiescence during FPGA reconfiguration. In embodiments of the disclosure, proxy agent firmware may enable downstream transactions (e.g., PCIe transactions) to be serviced during reconfiguration of the FPGA. Programmable logic states (e.g., PCIe configuration states or memory-mapped input/output (MMIO) states) are saved in memory and maintained by the proxy agent (via a management controller running the proxy agent). Once the FPGA is reconfigured, the state may be restored to the FPGA's programmable logic, and the FPGA may operate on the current state of the transactions.

20 Claims, 11 Drawing Sheets

METHOD AND APPARATUS TO ENABLE CPU HOST-UNAWARE DYNAMIC FPGA RECONFIGURATION

BACKGROUND

The present disclosure relates generally to integrated circuits, such as those including programmable logic circuitry (e.g., field-programmable gate arrays (FPGA) circuitry). More particularly, the present disclosure relates to maintaining FPGA communication capability during FPGA reconfiguration.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are found in numerous electronic devices, including computers, handheld devices, automobiles, and more. Some integrated circuits include programmable logic circuitry that can be configured to implement numerous possible systems. The programmable logic circuitry is often referred to as field-programmable gate array (FPGA) circuitry since it can be programmed in the field after manufacturing with such diverse functionality. FPGA circuitry has two operating modes—a configuration mode and a user mode. In the configuration mode, a configuration program (bitstream) for a system design is programmed into the FPGA circuitry in a process referred to as "configuration." During configuration, the programmable logic of the FPGA becomes inactive and thus cannot complete tasks or process or service requests from host applications communicatively coupled to the FPGA. As such, the host applications running on the FPGA may be paused or quiesced during configuration. Once configured, the FPGA circuitry enters the user mode, where the FPGA circuitry becomes active and resumes servicing requests from the host applications, and the host applications may resume operation.

FPGA deployments (e.g., datacenter deployments) may enable the capability of dynamic FPGA reconfiguration (e.g., runtime reconfiguration). Runtime reconfiguration may reconfigure the entire FPGA (full reconfiguration) or may reconfigure a portion of the FPGA (partial reconfiguration) which may impact a particular Peripheral Component Internet Express (PCIe) physical and/or virtual function hosted by the FPGA. This capability is often used to service the FPGA function (e.g., update security, update network routing policy in a network interface controller (NIC), implement patches, and so on). During an interval in which the FPGA is being reconfigured, the FPGA may be unable to service any or a portion of downstream PCIe requests from a host, and applications running on the host may be quiesced. This may lead to longer processing times, the applications may stall, and the electronic device may experience timeouts or may otherwise be undesirably impacted.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
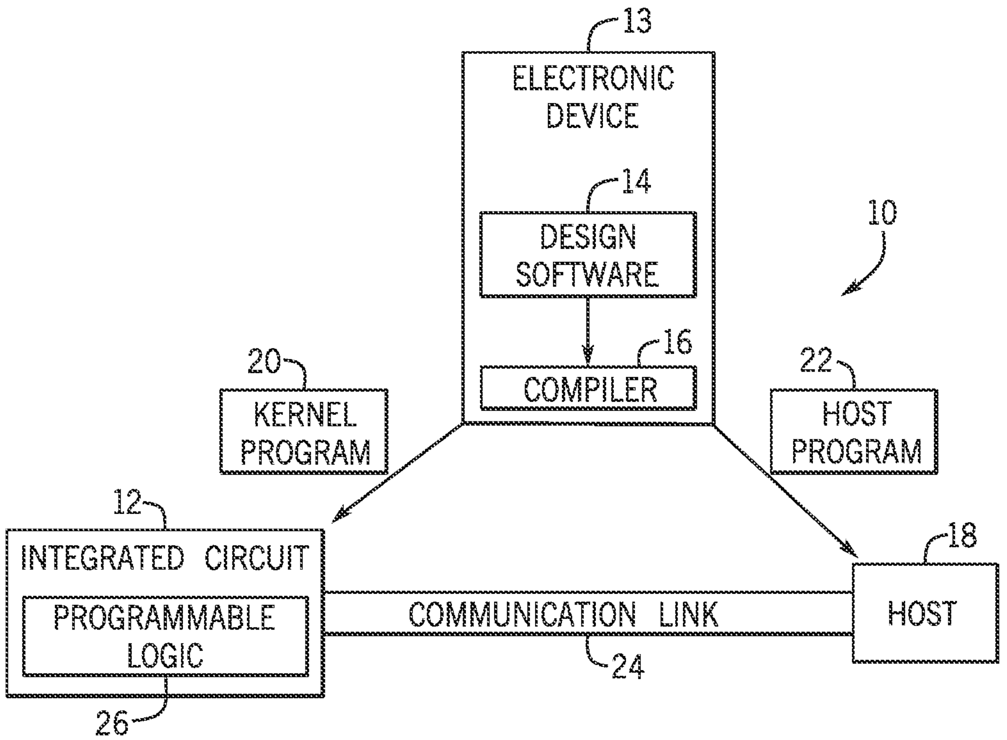
FIG. 1 is a block diagram of a system used to program an integrated circuit, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Programmable logic devices are increasingly permeating markets and are increasingly enabling customers to implement circuit designs in logic fabric (e.g., programmable logic). Certain programmable logic devices, such as those containing field programmable gate array (FPGA) circuitry may use static random-access memory (SRAM) as configuration memory (CRAM), and thus lose their programming when they are powered down and thus are reprogrammed when powered on. A programmable logic device that uses field programmable gate array circuitry may be referred to as an FPGA, though it should be appreciated that other integrated circuits may include such programmable logic circuitry even if not expressly referred to as an FPGA. For ease of discussion, integrated circuits that include programmable logic circuitry will be referred to as an FPGA in the text below. FPGA circuitry has two operating modes—a configuration mode and a user mode. In the configuration mode, a configuration program (bitstream) for a system design is programmed into the FPGA circuitry in a process referred to as "configuration." Once configured, the FPGA circuitry enters the user mode, where the FPGA circuitry becomes active and implements the system that was programmed into the FPGA circuitry during the configuration mode (e.g., such that the user system design may operate on data).

Runtime reconfiguration may reconfigure the entire FPGA (full reconfiguration) or may reconfigure a portion of the FPGA (partial reconfiguration) which may impact a particular Peripheral Component Internet Express (PCIe) physical and/or virtual function hosted by the FPGA. This capability is often used to service the FPGA function (e.g., update security, update network routing policy in a network interface controller (NIC), implement patches, and so on). During an interval in which the FPGA is being reconfigured, the FPGA may be unable to service any or a portion of downstream PCIe requests from a host, and applications running on the host may be quiesced. This may lead to longer processing times, the applications may stall, and the electronic device may experience timeouts or may otherwise be undesirably impacted.

The present disclosure is directed to enabling operation of the FPGA while preventing application quiescence during FPGA reconfiguration. In embodiments of the disclosure, proxy agent firmware (referred to herein as a proxy agent) may enable downstream transactions (e.g., PCIe transactions) to be serviced during reconfiguration of the FPGA. Programmable logic states (e.g., PCIe configuration states or memory-mapped input/output (MMIO) states) are saved in memory and maintained by the proxy agent (via an on-die management controller running the proxy agent). Once the FPGA is reconfigured, the state space may be restored to the FPGA's programmable logic, and the FPGA may operate on the current state of the transactions.

With the foregoing in mind, FIG. 1 illustrates a block diagram of a system 10 that may be used in configuring an integrated circuit. A designer may desire to implement functionality on an integrated circuit 12 (e.g., a programmable logic device such as a field-programmable gate array (FPGA)) or an application-specific integrated circuit (ASIC) that includes programmable logic circuitry). The integrated circuit 12 may include a single integrated circuit, multiple integrated circuits in a package, or multiple integrated circuits in multiple packages communicating remotely (e.g., via wires or traces). In some cases, the designer may specify a high-level program to be implemented, such as an OPENCL® program, which may enable the designer to more efficiently and easily provide programming instructions to configure a set of programmable logic cells for the integrated circuit 12 without specific knowledge of low-level hardware description languages (e.g., Verilog, very high speed integrated circuit hardware description language (VHDL)). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

In a configuration mode of the integrated circuit 12, a designer may use an electronic device 13 (e.g., a computer) to implement high-level designs (e.g., a system user design) using design software 14, such as a version of INTEL® QUARTUS® by INTEL CORPORATION. The electronic device 13 may use the design software 14 and a compiler 16 to convert the high-level program into a lower-level description (e.g., a configuration program, a bitstream). The compiler 16 may provide machine-readable instructions representative of the high-level program to a host 18 and the integrated circuit 12. The host 18 may receive a host program 22, which may be implemented by the kernel programs 20. To implement the host program 22, the host 18 may communicate instructions from the host program 22 to the integrated circuit 12 via a communications link 24, which may be, for example, direct memory access (DMA) communications or peripheral component interconnect express (PCIe) communications. In some embodiments, the kernel programs 20 and the host 18 may enable configuration of programmable logic 26 on the integrated circuit 12. The programmable logic 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Thus, embodiments described herein are intended to be illustrative and not limiting.

A controller may receive the programs 20 and 22 (bitstreams) and operate to configure the integrated circuit 12 according to the programs 20 and 22 (bitstreams). For example, as depicted in FIG. 2, the integrated circuit 12 may be a FPGA that may be reconfigured according to the programs 20 and 22 (bitstreams) to perform a wide range of tasks and/or functions.

Figure 2:
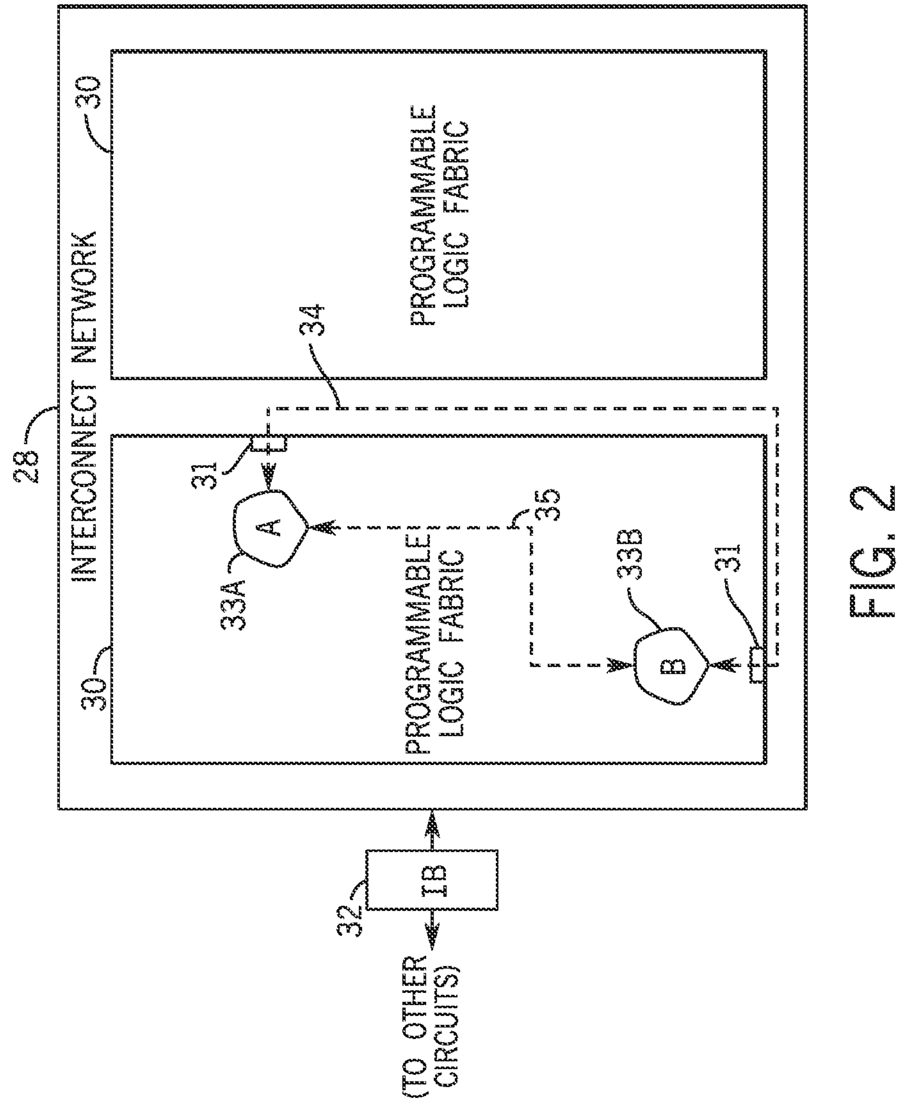
FIG. 2 is a block diagram of the integrated circuit of FIG. 1, in accordance with an embodiment of the present disclosure.

FIG. 2 is a block diagram of the integrated circuit 12 of FIG. 1 and includes a programmable interconnect network 28 (e.g., network-on-chip (NOC)) and programmable logic fabric 30 that is programmable (and reprogrammable) based on the programs 20 and/or 22 (bitstreams). The programmable logic fabric 30 may include a number of programmable logic elements having operations defined by configuration memory (e.g., configuration random access memory (CRAM)). The programmable logic elements may include look-up tables, registers, multiplexers, routing wires, and so forth. A designer may program the programmable logic fabric 30 to perform a variety of desired functions. The programmable interconnect network 28 and the programmable logic fabric 30 may be programmed at a similar or same time. Portions or regions of the programmable logic fabric 30 may be programmed to perform different functions and/or replications of the same function. Sometimes, the programmable logic fabric 30 is programmed to interact with other circuitry via interconnect boundary circuitry 31 and an interconnect block 32. The other circuitry may include any combination of memory, transceiver, ASICs, and/or any suitable circuitry that may also be used in addition to programmable logic fabric 30 to perform processing or functional operations associated with the integrated circuit 12. The programmable interconnect network 28 may be used to facilitate memory transactions between multiple sectors, multiple dies, and/or between the integrated circuit 12 and external systems. The programmable interconnect network 28 may be further for decrypting configuration programs (bitstreams) (e.g., configuration data), for locally sequencing reads and writes to implement error detection and correction on the memory, and/or for sequencing test control signals to effect various test modes.

The programmable logic fabric 30 may have two separately programmed portions, portion 33A and portion 33B. The portion 33A may perform a processing operation separate from the portion 33B. The processing operation of the portion 33A may be unique and therefore different from the processing operation of the portion 33B. In some cases, the portions 33 may transmit data between each other in order to complete the processing operation. For example, the portion 33A may identify a face in an image and the portion 33B may perform processing on the image excluding the face. In this way, it may be desirable to transmit data from the portion 33A to the portion 33B in order to complete the processing operation.

There may be multiple ways to do this. One technique may be used to send the data from the portion 33A to the portion 33B via a data path 34 of the programmable interconnect network 28. Another technique may be used to send the data from the portion 33A to the portion 33B via a data path 35 of the programmable logic fabric 30. Using the data path 35 may be a slower, less efficient method of transmitting the data from the portion 33A to the portion 33B. In addition, the data path 35 may use precious programmable logic fabric 30 in the path, making it a higher cost option than the data path 34 of the programmable interconnect network 28. The portion 33A may transmit data to the data path 34 via the interconnect boundary circuitry 31. As will be appreciated, the interconnect boundary circuitry 31 may include a variety of circuitry to facilitate the packetizing and/or transmission of the data between the portions 33. For example, the interconnect boundary circuitry 31 may couple to application functional units of the integrated circuit 12 and may use bridge circuitry to transition data between the portions 33 and the programmable interconnect network 28.

Figure 3:
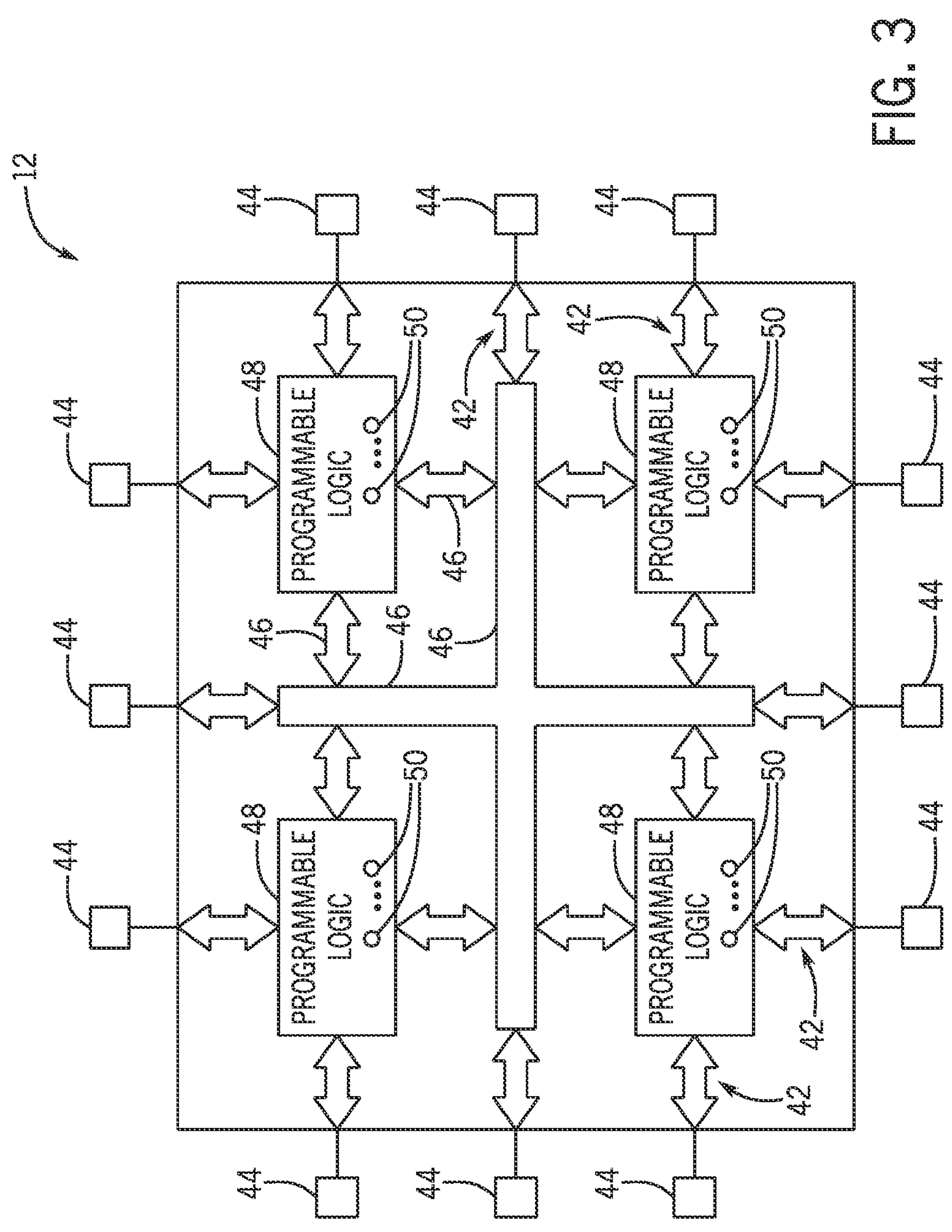
FIG. 3 is a block diagram of an example of the integrated circuit of FIG. 1 as a programmable logic device, in accordance with an embodiment of the present disclosure.

Turning now to a more detailed discussion of the integrated circuit 12, FIG. 3 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). The integrated circuit 12 may have input/output circuitry 42 for driving signals off of the device (e.g., integrated circuit 12) and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 26 may include combinational and sequential logic circuitry. For example, programmable logic 26 may include look-up tables, registers, and multiplexers. In various embodiments, the programmable logic 26 may be configured to perform a custom logic function. The programmable interconnects associated with interconnection resources may be considered to be a part of programmable logic 26.

Programmable logic devices, such as the integrated circuit 12, may include programmable elements 50 with the programmable logic 26. For example, as discussed above, a designer (e.g., a customer) may program (e.g., configure) or reprogram (e.g., reconfigure, partially reconfigure) the programmable logic 26 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming (i.e., configuration), configuration data is loaded into the memory cells using input/output pins 44 and input/output circuitry 42. In one embodiment, the memory cells may be implemented as random-access-memory (RAM) cells. The use of memory cells based on RAM technology is described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 26. For instance, in some embodiments, the output signals may be applied to the gates of metal-oxide-semiconductor (MOS) transistors within the programmable logic 26.

Figure 4:
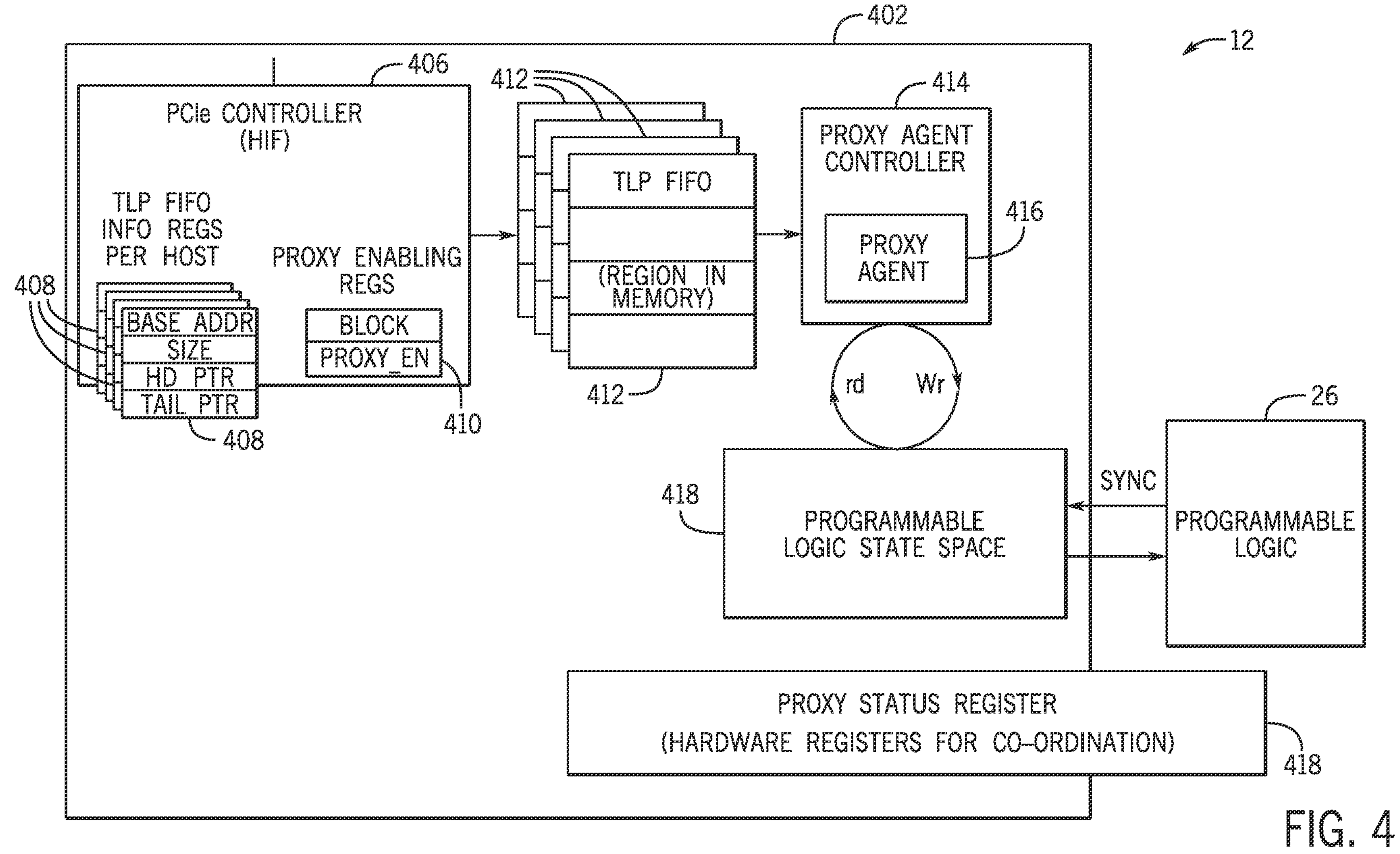
FIG. 4 is a schematic diagram of a field programmable gate array (FPGA) implemented with proxy circuitry, in accordance with an embodiment of the present disclosure.

FIG. 4 is a schematic diagram of an integrated circuit 12 that may implement proxy circuitry 402, in accordance with an embodiment of the present disclosure. The proxy circuitry 402 may enable downstream transactions (e.g., PCIe transactions) to be serviced during reconfiguration of the integrated circuit 12 to prevent application quiescence during FPGA reconfiguration. Programmable logic states (e.g., PCIe configuration states or memory-mapped input/output (MMIO) states) are saved in memory and maintained by the proxy circuitry 402 (e.g., proxy agent 416). Once the integrated circuit 12 is reconfigured, the state space may be restored to programmable logic 26, and the integrated circuit 12 may operate on the current state of the transactions. It should be noted that, while the proxy circuitry 402 is described as hardened circuitry, it may, in some embodiments, be configured as soft logic into part of the programmable logic 26 (e.g., such that the proxy handling may be provided by a portion of the programmable logic 26 that is not being configured during partial reconfiguration).

The proxy circuitry 402 includes a host link interface (HIF) controller 406 (e.g., a PCIe controller) coupled to and serving as an interface between one or more hosts (e.g., 18).

The HIF 406 includes one or more transaction layer packet (TLP) first-in-first-out (FIFO) information registers 408 (e.g., one per host) that may describe one or more TLP FIFO buffers (e.g., 412, as will be discussed in greater detail below) and one or more proxy enabling registers 410. The information registers 408 may include information such as TLP FIFO base address, size, head pointer, tail pointer, and so on. The proxy circuitry 402 may include a proxy agent 416 running on an on-die proxy agent controller 414. The proxy enabling registers 410 may be used to enable and/or disable the proxy agent 416. The integrated circuit 12 may, via the proxy circuitry 402, enable the management (referred to herein as proxy handling) of PCIe cycles from a host when the integrated circuit 12 (e.g., the programmable logic 26) is undergoing reconfiguration.

The integrated circuit 12 may operate in three proxy handling modes: full proxy mode, full MMIO proxy mode, and partial MMIO proxy mode. In the full proxy mode, the PCIe cycles managed by the integrated circuit 12 include an MMIO state and PCIe configuration state. Both the MMIO state and the PCIe configuration state may be handled by the proxy agent 416 during reconfiguration. In the full MMIO proxy mode, the PCIe configuration state is not managed by the programmable logic 404 but by a hardened PCIe controller (e.g., the HIF 406) on die (e.g., and therefore does not quiesce during reconfiguration and thus does undergo proxy handling). The programmable logic 404 undergoes full reconfiguration, and thus at least a portion of the MMIO state is maintained by the proxy agent 416 during reconfiguration and thus undergoes proxy handling during reconfiguration. In the partial MMIO proxy mode, the PCIe configuration state is not managed by the programmable logic 404, and the programmable logic 404 undergoes partial reconfiguration. Consequently, only MMIO cycles targeting MMIO base address registers (BAR) of impacted functions are maintained by the proxy agent 416 during reconfiguration.

The proxy circuitry 402 may include spaces created (e.g., by the proxy agent 416) in memory (e.g., a local SRAM or DDR memory), such as one or more FIFOs 412 (e.g., one per host) and a state proxy space 418. The one or more FIFOs 412 may store inbound PCIe TLPs for the proxy agent 416 to read and process when proxy handling is enabled. The state proxy space 418 may be created in double data rate (DDR) memory by the proxy agent 416 to enable a sufficiently large space to be created in memory to maintain a programmable logic state during reconfiguration. The state proxy space 418 may include an MMIO proxy space, where the MMIO state may be stored and maintained by the proxy agent 416. The state proxy space 418 may also include a PCIe configuration proxy space, where the proxy agent 416 may maintain the configuration state for impacted functions or may maintain configuration space for a PCIe hierarchy per each host (e.g., in case the proxy circuitry 416 operates in the full proxy mode), and any associated configuration states for the PCIe hierarchy.

The integrated circuit 12 includes a proxy status register 420. The proxy status register 420 may be maintained on-die and be accessible to the proxy agent 416, the HIF 406, and programmable logic 404. The proxy status register 420 may be used by the proxy agent 416, the HIF 406 and the programmable logic 404 to communicate and synchronize with each other (e.g., by keeping track of the state of the programmable logic 404, at what stage the proxy circuitry 402 is in proxy handling, and so on). The HIF 406 and the programmable logic 404 may use the proxy status register 420 to enable or disable the proxy agent 416.

The proxy status register 420 may store memory address ranges for the state proxy space 418 and may store a proxy status associated with the proxy agent 416. The proxy status may include an idle state, a push state, an enabled state, a stop state, and a pull state. The idle state may include a baseline state. In the push state, the proxy agent 416 (e.g., via the HIF 406) may inform the programmable logic 404 to push the current programmable logic state info to the state proxy space 418. In the enabled state, the proxy agent 416 may write when it has enabled MMIO proxy. In the stop state, the programmable logic 404 may write to request the proxy agent 416 to disable MMIO proxy for a function (e.g., when reconfiguration is complete and the integrated circuit 12 reenters the user mode). In the pull state, the proxy agent 416 (e.g., via the HIF 406) may indicate to the programmable logic 404 that the programmable logic 404 may pull the state that was being maintained by the proxy agent 416 from the state proxy space 418 (e.g., to enable the programmable logic 404 to operate in user mode).

Figure 5:
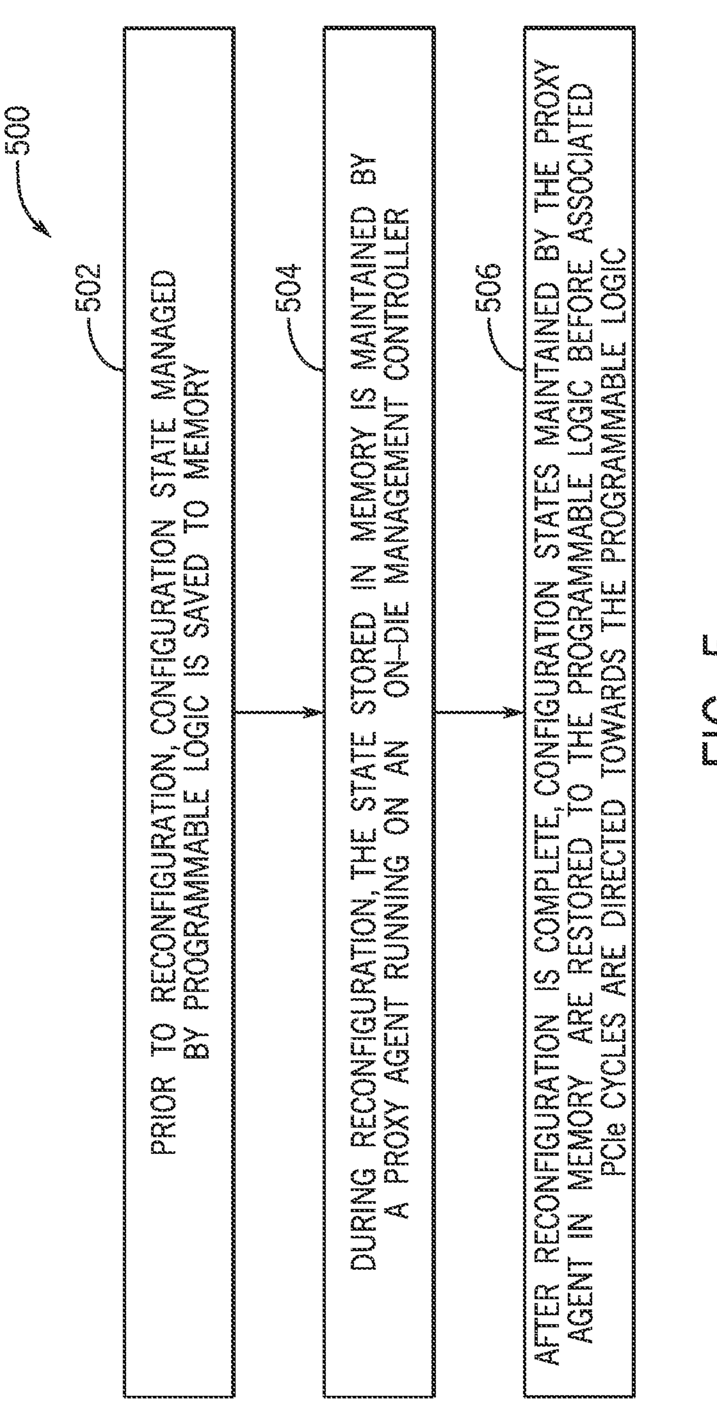
FIG. 5 is a flowchart of a method for maintaining operation of the FPGA (e.g., servicing downstream PCIe cycles) while the FPGA is in configuration mode via the proxy circuitry, in accordance with an embodiment of the present disclosure.

The integrated circuit 12 may carry out the proxy handling (e.g., using one of the three modes discussed above) to enable servicing of downstream PCIe cycles during reconfiguration. FIG. 5 is a flowchart of a method 500 for maintaining operation of the integrated circuit 12 (e.g., servicing downstream PCIe cycles) using the proxy circuitry 402 while the integrated circuit 12 is in configuration mode, in accordance with an embodiment of the present disclosure. In process block 502, prior to reconfiguration of the programmable logic 404, the proxy circuitry 402 stores a programmable logic state (e.g., a state managed by programmable logic 404) to memory (e.g., the state proxy space 418).

In process block 504, during reconfiguration, the state stored in the state proxy space 418 is maintained by the proxy agent 416 running on an on-die management controller (e.g., the proxy agent controller 414). In the process block 504, the proxy agent 416 may enable MMIO writes to the integrated circuit 12 to effectuate updates to the programmable logic states stored in the state proxy space 418. MMIO writes to invalid addresses may be dropped during proxy handling. Some MMIO writes to some registers (e.g., registers maintained in the programmable logic 26) may not have side effects, and in such a case the MMIO writes may be handled by the proxy agent 416 to only update a targeted register. But other registers, when written to, may have side effects in updating other registers as well. For example, in some cases writing 1 to a particular target register triggers are "clear" of another register. In such a case, the proxy agent 416 may handle the updates to all the registers affected by the side effects.

In the process block 504, the proxy agent 416 may cause MMIO reads to the state to return a current value. If a particular MMIO range is directly mapped to FPGA-attached physical memory bypassing the programmable logic 26 the particular MMIO range may continue to be directly processed (e.g., will not undergo proxy handling via the proxy circuitry 402). MMIO writes to the state that may result in an operation such as an update of device memory, fetching data from or updating host memory, and so on, the proxy agent 416 may only update the state, such that the operation may be performed by the programmable logic 26 when reconfiguration is complete and the integrated circuit 12 resumes operating in the user mode.

In the process block 504, the proxy agent 416 may handle configuration state reads or writes. For example, the proxy agent 416 may perform PCIe functional level reset (FLR) handling. If FLR is initiated for a function for which the proxy agent 416 is active (e.g., a function that impacts the programmable logic 26), the handling may be delayed until the reconfiguration is complete and the integrated circuit 12 is operating in the user mode by issuing a configuration request retry status (CRS) from the HIF 406 directly, or from the proxy agent 416. It should be noted that the completion for the write configuration that initiated FLR will not be delayed. When the integrated circuit 12 returns to user mode, pending FLRs may be sent to the programmable logic 26 for processing.

In the process block 504, the proxy agent may perform message transaction layer packet (TLP) handling. Some message TLPs may be handled by the HIF 406 on die. Message TLP handling may include address translation service (ATS) invalidation handling. If the reconfiguration impacts an ATS cache, then the proxy agent 416 may assume that the ATS cache is cleared and not preserved during the reconfiguration. Thus, the proxy agent 416 may respond to ATS invalidation requests with an ATS_Invalidation_Done message.

In process block 506, once the programmable logic 26 reconfiguration is complete, programmable logic states (e.g., MMIO and configuration states) that were maintained by the proxy circuitry 402 in memory (e.g., stored in the state proxy space 418) may be restored to the programmable logic 26. The states may be restored to the programmable logic 26 before PCIe cycles are again directed to the programmable logic 26.

Figure 6:
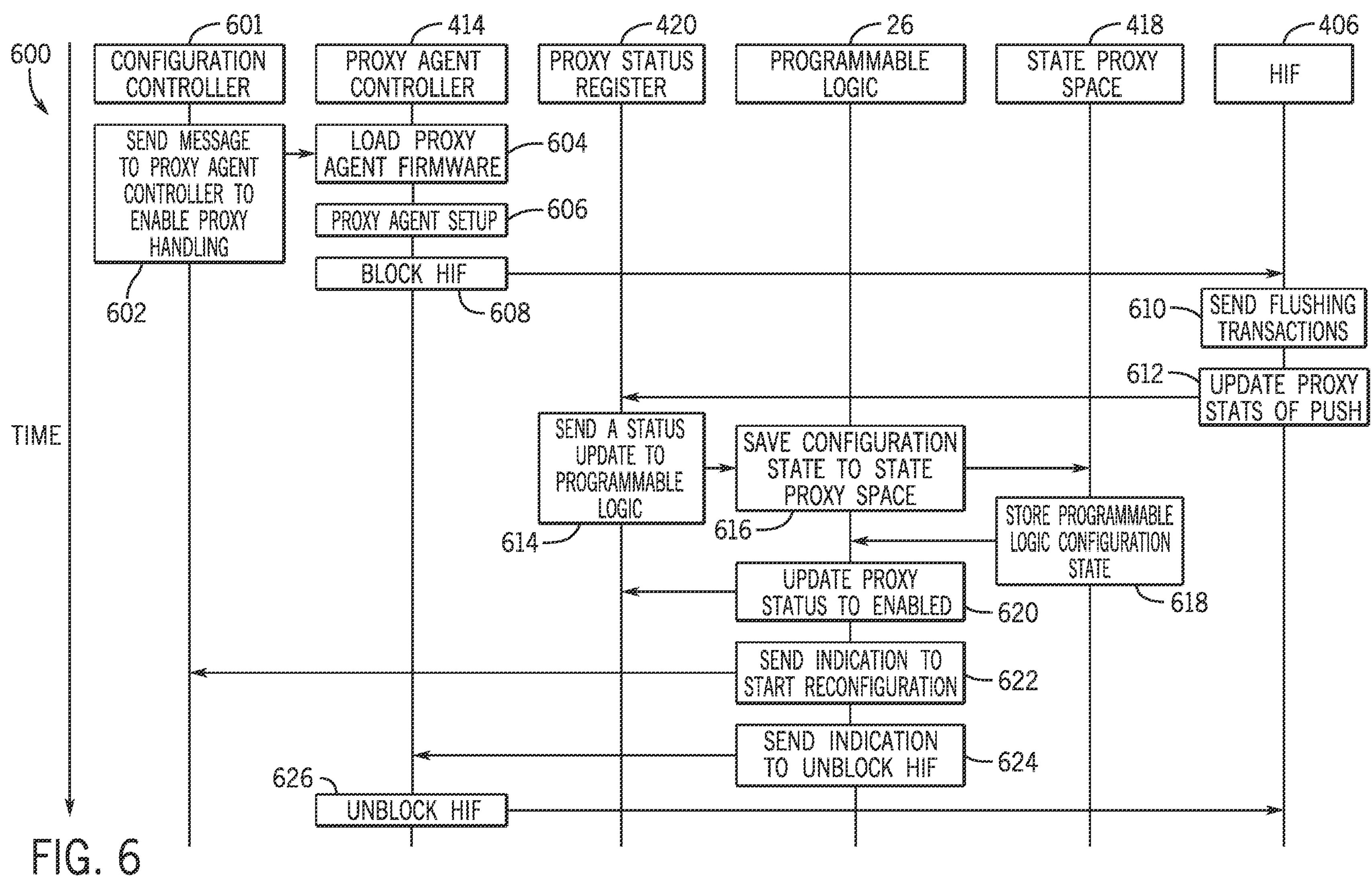
FIG. 6 is a flowchart of a method for transitioning the FPGA from user mode to configuration mode and enabling the proxy agent, in accordance with an embodiment of the present disclosure.

FIG. 6 is a flowchart of a method 600 for transitioning the integrated circuit 12 from user mode to configuration mode and enabling the proxy agent 416, in accordance with an embodiment of the present disclosure. In process block 602, a configuration controller 601 (e.g., a secure device manager (SDM)) may send a message to the proxy agent controller 414 to enable proxy handling. It should be noted that in some embodiments the configuration controller 601 and the proxy agent controller 414 may include the same physical micro-controller. In process block 604 the proxy agent controller loads the proxy agent 416. In process block 606 the proxy agent sets up proxy handling. In the process block 606 the proxy agent 416 may set up the FIFOs 412 and the state proxy space 418 in memory. In the process block 606 the proxy agent 416 updates the proxy status register 420 with the address range for the state proxy space 418. In process block 608 the proxy agent 416 blocks the HIF 406 (e.g., from pushing any TLPs downstream) and informs the HIF 406 of the start address and the size of the FIFOs 412. Blocking the HIF 406 includes blocking transmission of an event like FLR to the programmable logic 26.

In process block 610 the HIF 406 may send a flushing transaction (e.g., zero-length reads (ZLR)) to flush outstanding posted PCIe writes towards the programmable logic 26. The HIF 406 may track all previous outstanding non-posted transactions (e.g., including ZLRs and FLRs that the HIF 406 may have sent) and determine whether the outstanding non-posted transactions were completed. In process block 612, the HIF 406 may send a status update indication to the proxy status register 420, causing the proxy status register 420 to update the proxy status to the push state.

In process block 614, the proxy status register 420 sends an indication to the programmable logic 26 (e.g., on a sideband interface) to indicate that the state is changed to push. In some embodiments, the programmable logic 26 may periodically or continuously poll the proxy status register 420 for a state update. The programmable logic 26 may check to ensure that it has serviced any ATS_invalidation_done messages. The programmable logic may read the state proxy space address from the proxy status register 420. In process block 616, the programmable logic 26 may save a current configuration state to the state proxy space 418. In process block 618, the state proxy space 418 may save the programmable logic state (e.g., configuration state or MMIO state) and update the programmable logic 26 when the programmable logic state is stored to memory. In process block 620, the programmable logic 26 may update the proxy status to enabled and in process block 622 send and indication to the configuration controller 601 to start the reconfiguration. In process block 624, the programmable logic 26 sends an indication to the proxy agent controller 414 to cause the proxy agent 416 to unblock the HIF 406. In process block 626 the proxy agent 416 unblocks the HIF 406.

Figure 7:
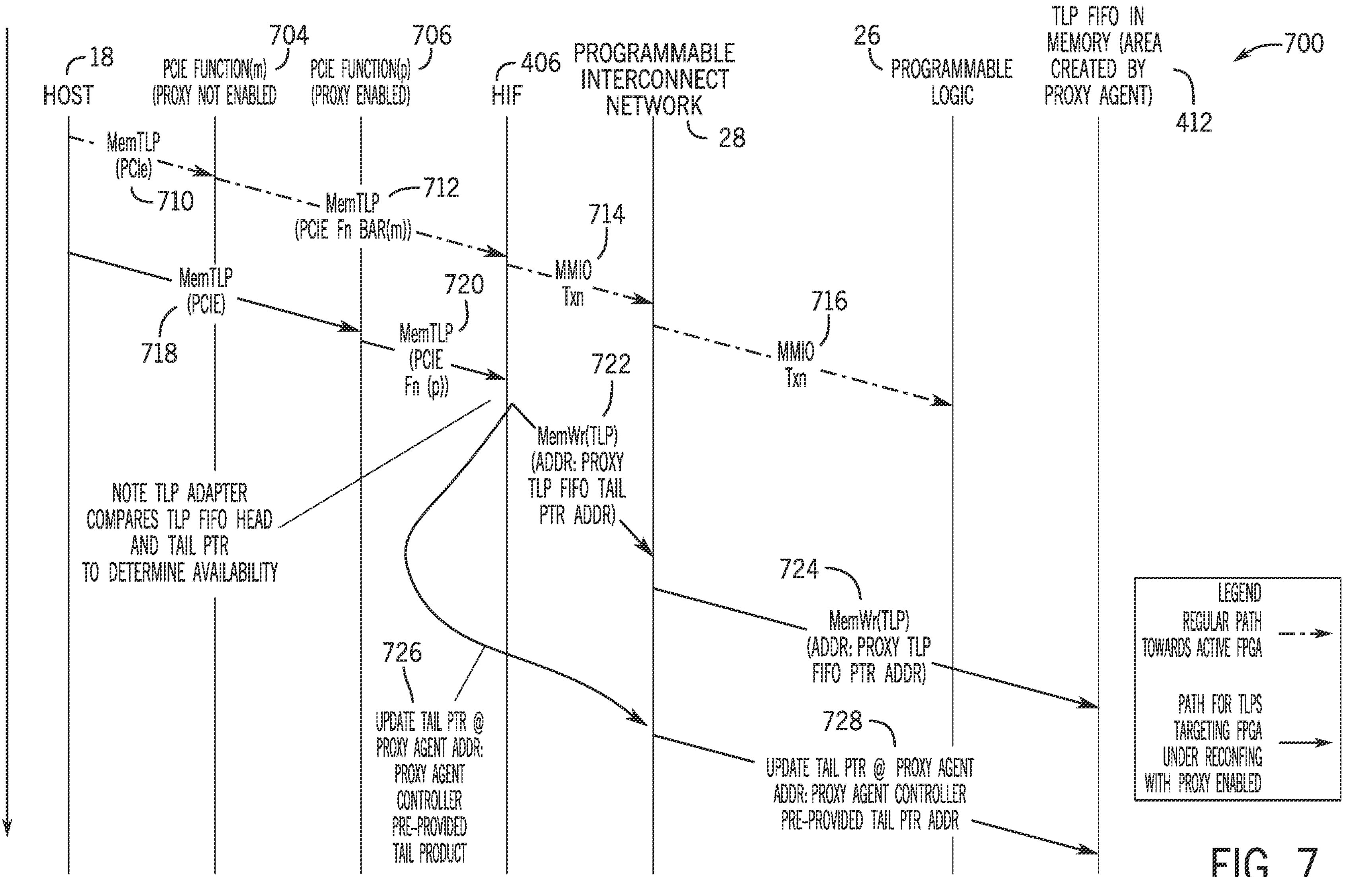
FIG. 7 is a flowchart of a method for rerouting PCIe transaction layer packets (TLPs) to TLP first-in-first-out (FIFO) data structures, in accordance with an embodiment of the present disclosure.

FIG. 7 is a flowchart of a method 700 for rerouting of PCIe TLPs to TLP FIFOs 412, in accordance with an embodiment of the present disclosure. The method 700 describes rerouting of PCIe TLPs to TLP FIFOs when proxy handling is not enabled on the integrated circuit 12 and describes rerouting of PCIe TLPs to TLP FIFOs 412 when proxy handling is enabled. Beginning with the path towards the active programmable logic 26 (e.g., when the integrated circuit 12 is in user mode), a host (e.g., 18) may send a message 710 (e.g., including PCIe configuration instructions) to a PCIe function 704 that is not impacted by the proxy agent 416. The PCIe function 704 may perform an action on the message 710 to generate message 712 and send the message 712 to the HIF 406. The HIF 406 sends a message 714 (e.g., including an MMIO transmission) to a programmable interconnect network 28 (e.g., a NOC). The programmable interconnect network 28, in message 716, routes the MMIO transmission to the programmable logic 26 of the integrated circuit 12, where the programmable logic 26 may perform an action based on the MMIO transmission.

The method 700 also describes rerouting of PCIe TLPs to TLP FIFOs 412 when proxy handling is enabled on the integrated circuit 12 (e.g., the integrated circuit 12 is in full proxy mode). When proxy handling is enabled (e.g., the proxy agent 416 is enabled), the host 18 may send a message 718 (e.g., including PCIe configuration instructions) to a PCIe function 706 that is impacted by the proxy agent 416 (bypassing the PCIe function 704). The PCIe function 706 may perform an action on the message 718 to generate message 720, and send the message 720 to the HIF 406. The HIF 406 may identify that the proxy agent 416 is enabled and performs action 722 (e.g., a memory TLP write including a tail pointer address indicating where in the TLP FIFO 412 the memory TLP write is directed). The HIF 406 may perform action 722 directly or may do so through the programmable interconnect network 28. The HIF 406 may indicate to the programmable interconnect network 28 to bypass the programmable logic 26 (e.g., as proxy agent 416 is enabled, indicating that the programmable logic 26 is in configuration mode) and the programmable interconnect network 28 writes to the TLP FIFO 412 in action 724. In action 726, the HIF 406 updates the tail pointer address of the memory TLP write. As with the action 724, the HIF 406 may perform the action 726 directly or may send the memory TLP write to the programmable interconnect network 28, and the programmable interconnect network 28 may update the tail pointer address in the TLP FIFO 412 in action 728. It should be noted that, in some cases, the messages sent and actions performed in the method 700 may be carried out at the same time (e.g., during a partial reconfiguration of the programmable logic 26).

Figure 8:
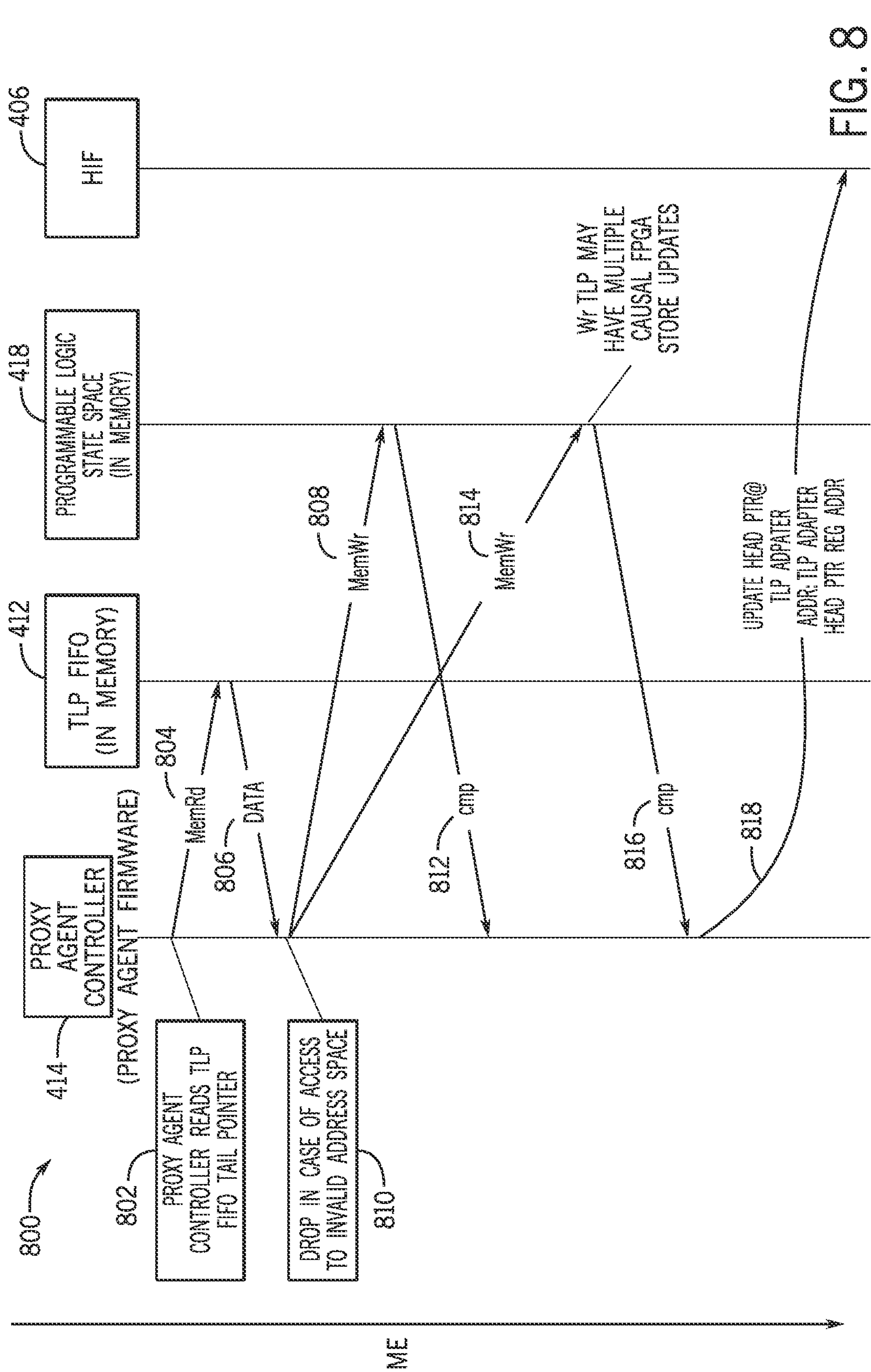
FIG. 8 is a flowchart of a method for servicing write TLPs while programmable logic of the FPGA is in configuration mode and the proxy circuitry of FIG. 4 is enabled, in accordance with an embodiment of the present disclosure.

FIG. 8 is a flowchart of a method 800 for servicing write TLPs during proxy handling, in accordance with an embodiment of the present disclosure. In action 802, the proxy agent 416 (e.g., running on the proxy agent controller 414) reads a TLP tail pointer. If the proxy agent 416 determines that the TLP FIFO 412 is not empty, in action 804 the proxy agent 416 submits a memory read TLP to the TLP FIFO 412. In action 806, the TLP FIFO 412 sends the data to the proxy agent 416. In action 808, the proxy agent 416 sends a memory write TLP to the state proxy space 418. However, as indicated by action 810, if an address space associated with the state proxy space 418 is invalid, the proxy agent 416 may drop the memory write TLP.

Once the memory write TLP has been written to the state proxy space 418, the state proxy space 418 sends the message 812 including an indication that the memory write TLP associated with the action 808 has been completed. In some cases, the proxy agent 416 may perform action 814 alongside the action 808, as a memory write TLP may include multiple causal programmable logic state updates. In action 816 the state proxy space 418 sends an indication that the memory write TLP associated with the action 814 has been completed. In the action 818, the proxy agent 416 updates a head pointer to inform the HIF 406 of the one or more changes that were made to the TLP FIFO 412. The writes discussed with respect to FIG. 8 may include posted and/or non-posted writes.

Figure 9:
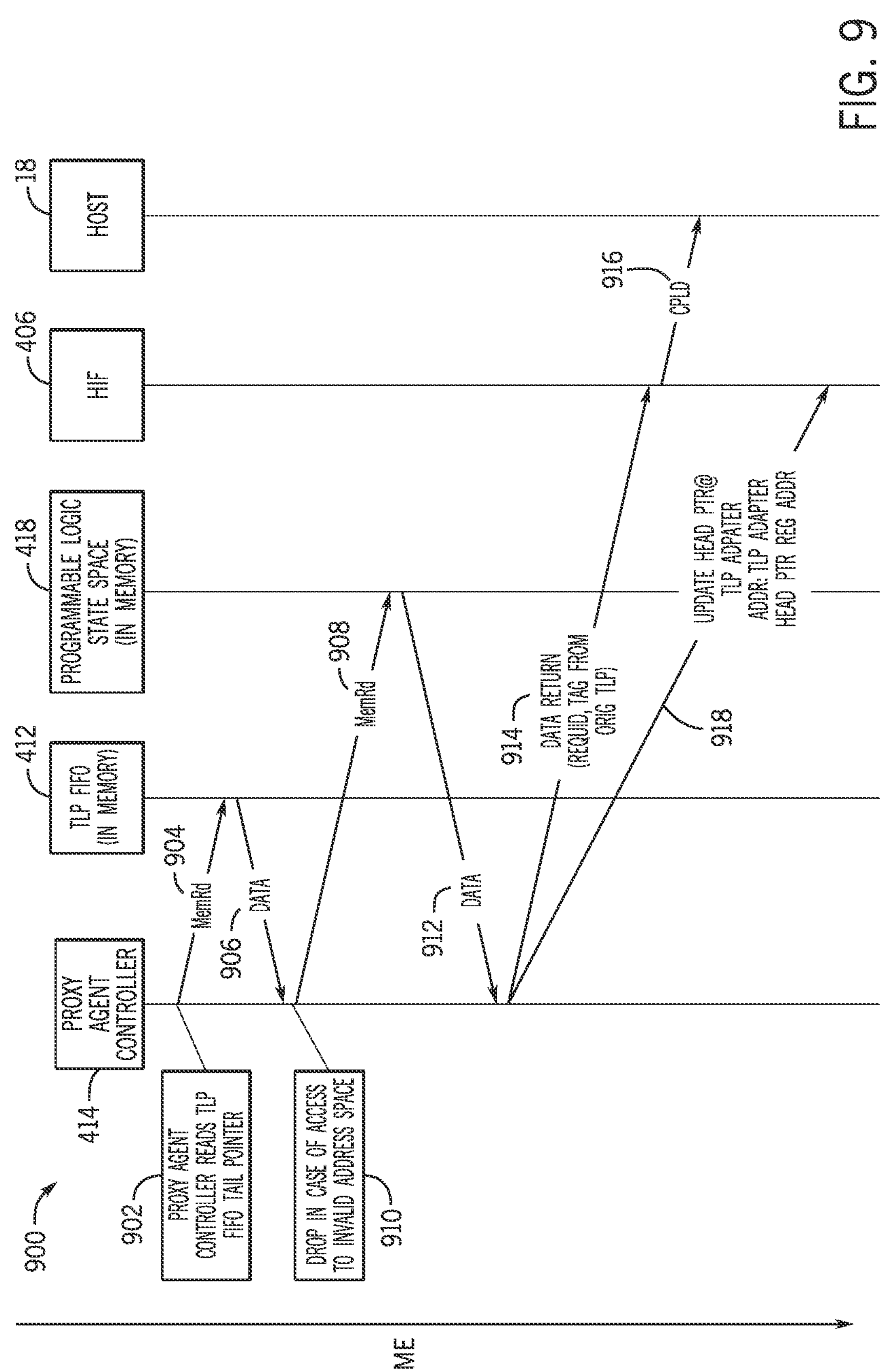
FIG. 9 is a flowchart of a method for servicing memory read TLPs during proxy handling, in accordance with an embodiment of the present disclosure.

FIG. 9 is a flowchart of a method 900 for servicing of read TLPs during proxy handling, in accordance with an embodiment of the present disclosure. Actions 902, 904, and 906 may be performed the same or in a similar manner to the actions 802, 804, and 806 discussed with respect to the method 800 in FIG. 8. In action 908, the proxy agent 416 sends a memory read TLP to the state proxy space 418. However, if the proxy agent 416 determines that that the address space corresponding to the memory read TLP of the action 908 is invalid, the proxy agent 416 may, in action 910, return a unsupported request (UR) error without performing the memory read TLP in action 908. However, if the address space is valid, in action 912, the state proxy space 418 sends data corresponding to the memory read TLP to the proxy agent 416.

In action 914, the proxy agent 416 returns the data received from the state proxy space 418 in the action 912 to the HIF 406. The HIF 406 sends message 916 including a completion with data (CPLD) indication to the host 18. In action 918, the proxy agent 416 updates a head pointer to inform the HIF 406 of the one or more changes that were made to the TLP FIFO 412.

Figure 10:
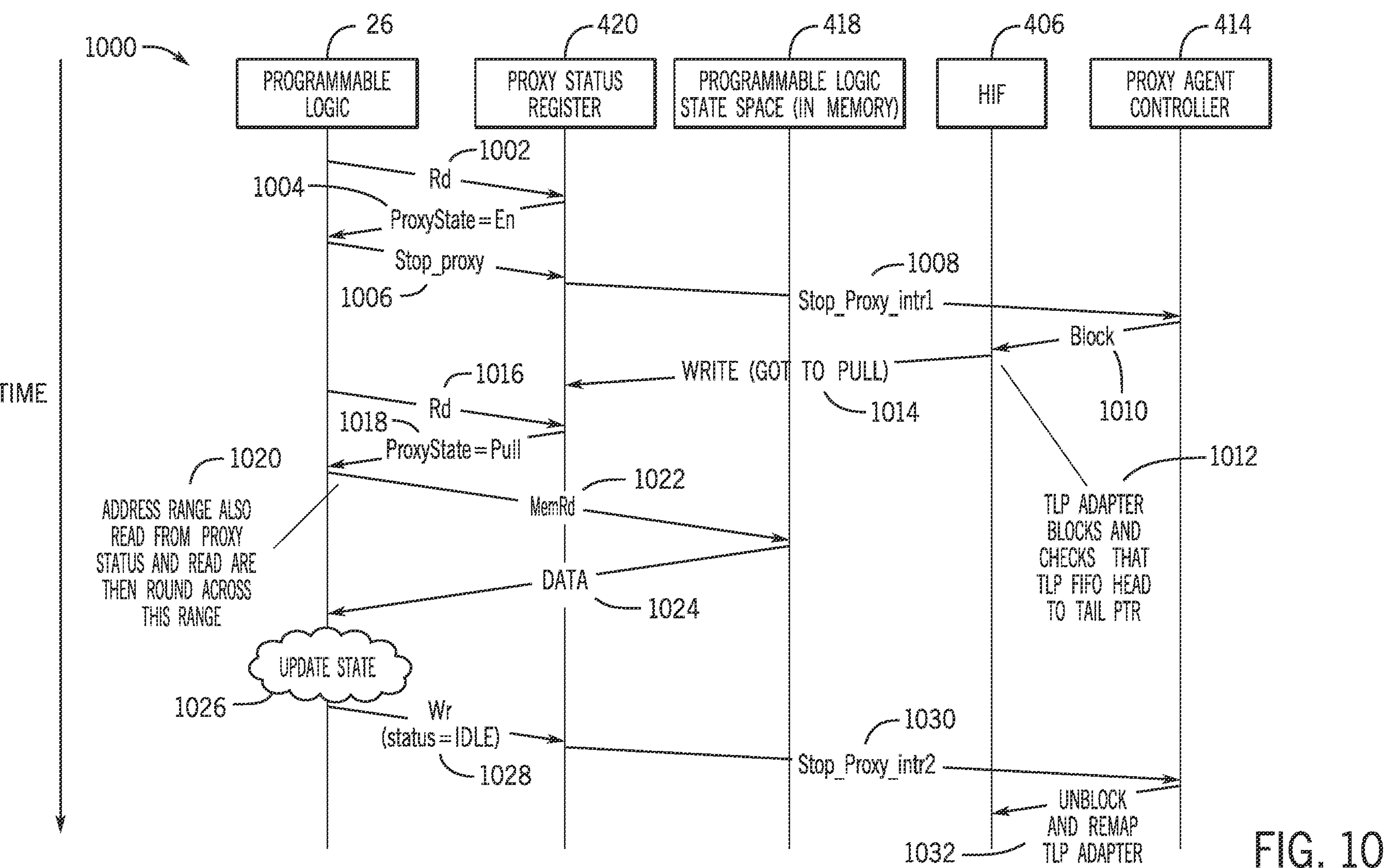
FIG. 10 is a flowchart of a method for terminating the proxy agent upon completion of FPGA reconfiguration, in accordance with an embodiment of the present disclosure.

FIG. 10 is a flowchart of a method 1000 for terminating the proxy agent 416 upon completion of FPGA reconfiguration, in accordance with an embodiment of the present disclosure. Once the programmable logic 26 completes reconfiguration and reenters user mode, the programmable logic may, in action 1002, send a memory read TLP to the proxy status register 420 to determine if the proxy agent 416 had been enabled during reconfiguration of the programmable logic 26. The proxy status register 420 sends a message 1004 indicating whether the proxy agent 416 had or had not been enabled during configuration mode. If the proxy status register 420 indicates in the message 1004 that the proxy agent 416 had been enabled, the programmable logic 26, in action 1006, updates the proxy status register 420 state to stop. In action 1008, the proxy status register 420 sends an interrupt to the proxy agent controller 414, stopping the proxy agent 416. In action 1010, the proxy agent controller 414 cause the HIF 406 to refrain from issuing downstream TLPs. In action 1012, the HIF 406 (e.g., via a TLP adapter) checks that the TLP FIFO 412 is completely serviced (e.g., by determining that the TLP FIFO head pointer=TLP FIFO tail pointer). When the HIF 406 determines that the TLP FIFO 412 is completely serviced, The HIF 406, in action 1014, writes the proxy status register 420 to the pull state.

In action 1016, the programmable logic 26 reads the state of the proxy status register 420. In message 1018, the proxy status register 420 sends the current state to the programmable logic 26. In action 1020, the programmable logic 26 reads an address range from the proxy status register 420 and issues one or more memory read TLPs across the address range. If the programmable logic 26 determines that the proxy status register 420 is in the pull state, the programmable logic 26, in action 1022, issues the one or more memory read TLPs to the state proxy space 418. The state proxy space 418, in the message 1024, returns relevant state data to the programmable logic 26 enabling the programmable logic 26 to, in action 1026, synchronize and update to the state indicated by the state proxy space 418. Once the programmable logic 26 updates, the programmable logic 26, in action 1028, writes the proxy status register 420 with the idle state. The proxy status register 420, in the action 1030, causes an interrupt to the proxy agent 416. The interrupt causes the proxy agent 416 to unblock the HIF 406, restore normal TLP handling, and unblock releasing events (e.g., pending FLRs towards the programmable logic 26). The action 1032 also causes the proxy agent 416 to remap a TLP adapter.

Figure 11:
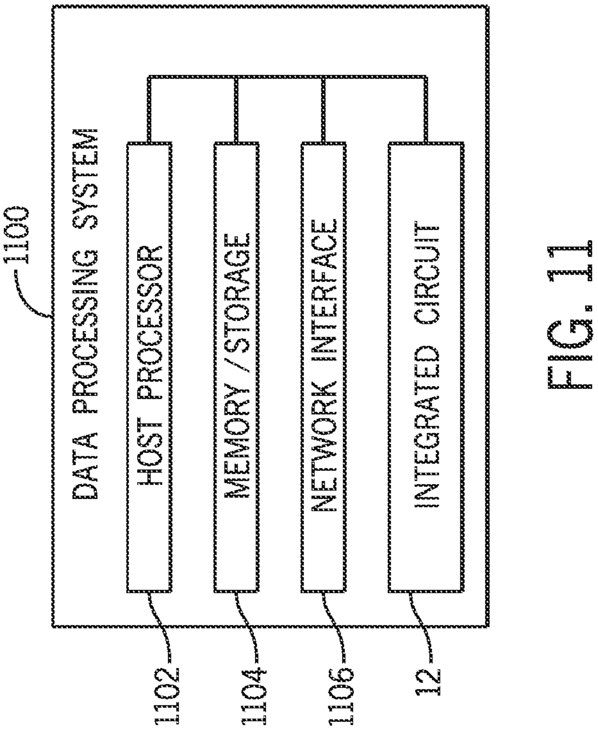
FIG. 11 is a block diagram of a data processing system that may use a programmable logic device to rapidly respond to data processing requests, in accordance with an embodiment of the present disclosure.

With the foregoing in mind, the integrated circuit 12 may be a data processing system or may be a component of a data processing system that may benefit from application of one of the many clock frequency ramping techniques described herein. For example, the integrated circuit 12 may be a component of a data processing system 1100, shown in FIG. 11. The data processing system 1100 includes a host processor 1102, memory and/or storage circuitry 1104, and a network interface 1106. The data processing system 1100 may include more or fewer components (e.g., electronic display, user interface structures, application specific integrated circuits (ASICs)). The host processor 1102 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 1100 (e.g., to perform machine learning, video processing, voice recognition, image recognition, data compression, database search ranking, bioinformatics, network security pattern identification, spatial navigation, or the like). The memory and/or storage circuitry 1104 may include random access memory (RAM), read-only memory (ROM), one or more hard drives, flash memory, or the like. The memory and/or storage circuitry 1104 may be considered external memory to the integrated circuit 12 and may hold data to be processed by the data processing system 1100. In some cases, the memory and/or storage circuitry 1104 may also store configuration programs (e.g., bitstreams) for programming the integrated circuit 12. The network interface 1106 may permit the data processing system 1100 to communicate with other electronic devices. The data processing system 1100 may include several different packages or may be contained within a single package on a single package substrate.

In one example, the data processing system 1100 may be part of a data center that processes a variety of different requests. For instance, the data processing system 1100 may receive a data processing request via the network interface 1106 to perform machine learning, video processing, voice recognition, image recognition, data compression, database search ranking, bioinformatics, network security pattern identification, spatial navigation, or some other specialized task. The host processor 1102 may cause the programmable logic fabric of the integrated circuit 12 to be programmed with a particular accelerator related to requested task. For instance, the host processor 1102 may instruct that configuration data (bitstream) stored on the memory/storage circuitry 904 or cached in sector-aligned memory of the integrated circuit 12 to be programmed into the programmable logic fabric (e.g., programmable logic 26) of the integrated circuit 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the integrated circuit 12 that are described here, the integrated circuit 12 may rapidly assist the data processing system 1100 in performing the requested task. Moreover, by using a reduced guardband made possible by the reduction in IR drop before operating in user mode, the integrated circuit 12 may consume less power, allowing the data processing system 1100 to consume less power overall.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically eras able programmable logic devices (EEPLDs), logic cell arrays (LCAs), field programmable gate arrays (FPGAs), application specific standard products (ASSPs), application specific integrated circuits (ASICs), and microprocessors, just to name a few.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENT 1

A method, comprising:

receiving an indication that a programmable device is to transition from a user mode to a configuration mode;

in response to receiving the indication, storing one or more states managed by the programmable device in the user mode;

maintaining the one or more states via proxy handling circuitry while the programmable device is in the configuration mode; and in response to receiving an indication that the programmable device transitions from the configuration mode to the user mode, restoring the one or more states to the programmable device.

EXAMPLE EMBODIMENT 2

The method of example embodiment 1, wherein the one or more states comprise a memory mapped input/output (MMIO) state, a Peripheral Component Internet Express (PCIe) configuration state, or both.

EXAMPLE EMBODIMENT 3

The method of example embodiment 1, wherein maintaining the one or more states via the proxy handling circuitry comprises:

- receiving memory mapped input/output state (MMIO) write commands; and
- storing the write commands in memory, the memory configured to update the programmable device when the programmable device transitions from configuration mode to user mode.

EXAMPLE EMBODIMENT 4

The method of example embodiment 3, wherein maintaining the one or more states via the proxy handling circuitry comprises:

- determining whether an MMIO write command is invalid; and
- in response to determining that the MMIO write command is invalid, dropping the MMIO write command.

EXAMPLE EMBODIMENT 5

The method of example embodiment 3, wherein maintaining the one or more states via the proxy handling circuitry comprises:

- determining whether MMIO commands are mapped to physical memory bypassing the programmable device; and
- if so, bypass the proxy handling circuitry and send the MMIO commands to the physical memory.

EXAMPLE EMBODIMENT 6

An integrated circuit comprising:

programmable logic; and proxy handling circuitry configured to service a plurality of transactions during reconfiguration of the programmable logic, the proxy handling circuitry comprising:

- a host interface controller configured to interface between the proxy handling circuitry and one or more hosts; and
- a proxy agent controller, the proxy agent controller configured to:
  - receive an indication that the programmable logic is to transition from a user mode to a configuration mode;

in response to receiving the indication, store one or more states managed by the programmable logic; and maintain the one or more states while the programmable logic is in the configuration mode, to enable servicing of host application transactions while the programmable logic is in the configuration mode.

EXAMPLE EMBODIMENT 7

The integrated circuit of example embodiment 6, wherein the proxy agent controller is configurable to create a state proxy space in memory, the state proxy space configured to store a memory mapped input/output (MMIO) state, store a Peripheral Component Internet Express (PCIe) configuration state, or both.

EXAMPLE EMBODIMENT 8

The integrated circuit of example embodiment 6, wherein the proxy handling circuitry comprises a proxy status register configured to store one or more proxy statuses of the proxy handling circuitry.

EXAMPLE EMBODIMENT 9

The integrated circuit of example embodiment 8, wherein the proxy status register is configured to enable or disable a proxy agent firmware running on the proxy agent controller.

EXAMPLE EMBODIMENT 10

The integrated circuit of example embodiment 6, wherein the proxy agent controller is configured to:

receive another indication that the programmable logic is to transition from the configuration mode to the user mode; and restore the one or more states to the programmable logic to enable the programmable logic to service subsequent host application transactions.

EXAMPLE EMBODIMENT 11

The integrated circuit of example embodiment 6, wherein the host interface controller comprises:

one or more transaction layer packet (TLP) first-in-first-out (FIFO) information registers; and one or more proxy enabling registers.

EXAMPLE EMBODIMENT 12

The integrated circuit of example embodiment 11, wherein the one or more TLP FIFO information registers are configured to store TLP base addresses, TLP sizes, TLP head pointers, TLP tail pointers, or any combination thereof.

EXAMPLE EMBODIMENT 13

The integrated circuit of example embodiment 6, wherein the proxy handling circuitry comprises a configuration controller configured to cause the proxy agent controller to load proxy agent firmware and initiate proxy agent setup.

EXAMPLE EMBODIMENT 14

The integrated circuit of example embodiment 6, Wherein the proxy agent controller is configured to create a first-in-first-out (FIFO) memory structure memory, the FIFO configured to store the host application transactions and send the host application transactions to the proxy agent controller for servicing.

EXAMPLE EMBODIMENT 15

The integrated circuit of example embodiment 14, wherein the FIFO memory structure is created in local static random access memory.

EXAMPLE EMBODIMENT 16

A tangible, non-transitory, computer-readable medium comprising computer-readable instructions that, when executed, cause one or more processors of an electronic device to:

receive an indication that a programmable device is to transition from a user mode to a configuration mode;

in response to receiving the indication, store one or more states managed by the programmable device in the user mode;

maintain the one or more states via proxy handling circuitry while the programmable device is in the configuration mode; and in response to receiving an indication that the programmable device transitions from the configuration mode to the user mode, restore the one or more states to the programmable device.

EXAMPLE EMBODIMENT 17

The tangible, non-transitory, computer-readable medium of example embodiment 16, comprising computer-readable instructions that, when executed, cause the one or more processors of the electronic device to cause the programmable device to operate in a full proxy mode, wherein a memory mapped input/output (MMIO) state and a Peripheral Component Internet Express (PCIe) state of the programmable device are each handled by the proxy handling circuitry while the programmable device is in the configuration mode.

EXAMPLE EMBODIMENT 18

The tangible, non-transitory, computer-readable medium of example embodiment 16, comprising computer-readable instructions that, when executed, cause the one or more processors of the electronic device to cause the programmable device to operate in a full memory mapped input/output (MMIO) proxy mode, wherein only an MMIO state of the programmable device is handled by the proxy handling circuitry while the programmable device is in the configuration mode.

EXAMPLE EMBODIMENT 19

The tangible, non-transitory, computer-readable medium of example embodiment 16, comprising computer-readable instructions that, when executed, cause the one or more processors of the electronic device to cause the programmable device to operate in a partial memory mapped input/output (MMIO) proxy mode, wherein a first portion of an MMIO state of the programmable device is handled by the proxy handling circuitry and a second portion of the MMIO state of the programmable device is handled by a hardened controller.

EXAMPLE EMBODIMENT 20

The tangible, non-transitory, computer-readable medium of example embodiment 16, wherein the one or more states comprise a memory mapped input/output (MMIO) state, a Peripheral Component Internet Express (PCIe) configuration state, or both.

What is claimed is:

1. A method, comprising:
receiving an indication that a programmable device is to transition from a user mode to a configuration mode;
in response to receiving the indication, storing one or more states managed by the programmable device in the user mode;
maintaining the one or more states via proxy handling circuitry while the programmable device is in the configuration mode, wherein maintaining the one or more states via the proxy handling circuitry comprises:
receiving memory mapped input/output state (MMIO) write commands; and
storing the write commands in memory, the memory configured to update the programmable device when the programmable device transitions from configuration mode to user mode; and
in response to receiving an indication that the programmable device transitions from the configuration mode to the user mode, restoring the one or more states to the programmable device.

2. The method of claim 1, wherein the one or more states comprise a memory mapped input/output (MMIO) state, a Peripheral Component Internet Express (PCIe) configuration state, or both.

3. The method of claim 1, wherein maintaining the one or more states via the proxy handling circuitry comprises:
determining whether an MMIO write command is invalid; and
in response to determining that the MMIO write command is invalid, dropping the MMIO write command.

4. The method of claim 1, wherein maintaining the one or more states via the proxy handling circuitry comprises:
determining whether MMIO commands are mapped to physical memory bypassing the programmable device; and
if so, bypassing the proxy handling circuitry and send the MMIO commands to the physical memory.

5. The method of claim 1, wherein maintaining the one or more states via the proxy handling circuitry comprises operating in at least one of a full proxy mode, a full MMIO mode, or a partial MMIO mode, wherein:
in the full proxy mode, an MMIO state and a Peripheral Component Internet Express (PCIe) state of the programmable device are each handled by the proxy handling circuitry while the programmable device is in the configuration mode;
in the full MMIO mode, only the MMIO state of the programmable device is handled by the proxy handling circuitry while the programmable device is in the configuration mode; and
in the partial MMIO mode, a first portion of the MMIO state of the programmable device is handled by the proxy handling circuitry and a second portion of the MMIO state of the programmable device is handled by a hardened controller.

6. An integrated circuit comprising:
programmable logic; and
proxy handling circuitry configured to service a plurality of transactions during reconfiguration of the programmable logic, the proxy handling circuitry comprising:
a host interface controller configured to interface between the proxy handling circuitry and one or more hosts; and
a proxy agent controller, the proxy agent controller configured to:
receive an indication that the programmable logic is to transition from a user mode to a configuration mode;
in response to receiving the indication, store one or more states managed by the programmable logic; and
maintain the one or more states while the programmable logic is in the configuration mode, to enable servicing of host application transactions while the programmable logic is in the configuration mode.

7. The integrated circuit of claim 6, wherein the proxy agent controller is configurable to create a state proxy space in memory, the state proxy space configured to store a memory mapped input/output (MMIO) state, store a Peripheral Component Internet Express (PCIe) configuration state, or both.

8. The integrated circuit of claim 6, wherein the proxy handling circuitry comprises a proxy status register configured to store one or more proxy statuses of the proxy handling circuitry.

9. The integrated circuit of claim 8, wherein the proxy status register is configured to enable or disable a proxy agent firmware running on the proxy agent controller.

10. The integrated circuit of claim 6, wherein the proxy agent controller is configured to:
receive another indication that the programmable logic is to transition from the configuration mode to the user mode; and
restore the one or more states to the programmable logic to enable the programmable logic to service subsequent host application transactions.

11. The integrated circuit of claim 6, wherein the host interface controller comprises:
one or more transaction layer packet (TLP) first-in-first-out (FIFO) information registers; and
one or more proxy enabling registers.

12. The integrated circuit of claim 11, wherein the one or more TLP FIFO information registers are configured to store TLP base addresses, TLP sizes, TLP head pointers, TLP tail pointers, or any combination thereof.

13. The integrated circuit of claim 6, wherein the proxy handling circuitry comprises a configuration controller configured to cause the proxy agent controller to load proxy agent firmware and initiate proxy agent setup.

14. The integrated circuit of claim 6, wherein the proxy agent controller is configured to create a first-in-first-out (FIFO) memory structure memory, the FIFO configured to store the host application transactions and send the host application transactions to the proxy agent controller for servicing.

15. The integrated circuit of claim 14, wherein the FIFO memory structure is created in local static random access memory.

16. The integrated circuit of claim 6, wherein the proxy handling circuitry is configured to operate in at least one of a full proxy mode, a full memory mapped input/output (MMIO) mode, or a partial MMIO mode, wherein:

in the full proxy mode, an MMIO state and a Peripheral Component Internet Express (PCIe) state of the programmable device are each handled by the proxy handling circuitry while the programmable device is in the configuration mode;

in the full MMIO mode, only the MMIO state of the programmable device is handled by the proxy handling circuitry while the programmable device is in the configuration mode; and in the partial MMIO mode, a first portion of the MMIO state of the programmable device is handled by the proxy handling circuitry and a second portion of the MMIO state of the programmable device is handled by a hardened controller.

17. A tangible, non-transitory, computer-readable medium comprising computer-readable instructions that, when executed, cause one or more processors of an electronic device to:

receive an indication that a programmable device is to transition from a user mode to a configuration mode;

in response to receiving the indication, store one or more states managed by the programmable device in the user mode;

maintain the one or more states via proxy handling circuitry while the programmable device is in the configuration mode in at least one of a full proxy mode, a full memory mapped input/output (MMIO) mode, or a partial MMIO mode, wherein:

in the full proxy mode, an MMIO state and a Peripheral Component Internet Express (PCIe) state of the programmable device are each handled by the proxy handling circuitry while the programmable device is in the configuration mode;

in the full MMIO mode, only the MMIO state of the programmable device is handled by the proxy handling circuitry while the programmable device is in the configuration mode; and in the partial MMIO mode, a first portion of the MMIO state of the programmable device is handled by the proxy handling circuitry and a second portion of the MMIO state of the programmable device is handled by a hardened controller; and in response to receiving an indication that the programmable device transitions from the configuration mode to the user mode, restore the one or more states to the programmable device.

18. The tangible, non-transitory, computer-readable medium of claim 17, wherein the one or more states comprise a memory mapped input/output (MMIO) state, a Peripheral Component Internet Express (PCIe) configuration state, or both.

19. The tangible, non-transitory, computer-readable medium of claim 17, wherein the computer-readable instructions comprise instructions that, when executed, cause the one or more processors to configure the proxy handling circuitry to create a first-in-first-out (FIFO) memory structure memory, the FIFO configured to store the host application transactions and send the host application transactions to the proxy agent controller for servicing.

20. The tangible, non-transitory, computer-readable medium of claim 19, wherein the FIFO memory structure is created in local static random access memory.

* * * * *